United States Patent [19]
Bartlett et al.

[11] Patent Number: 5,646,444
[45] Date of Patent: Jul. 8, 1997

[54] APPARATUS AND METHOD FOR MOUNTING A COMPONENT TO AN ELECTRICAL CIRCUIT

[75] Inventors: Michael H. Bartlett, Hurst; Michael C. Wuensch, Fort Worth, both of Tex.

[73] Assignee: Motorola, Inc., Schaumburg, Ill.

[21] Appl. No.: 539,563

[22] Filed: Oct. 5, 1995

[51] Int. Cl.$^6$ .............................. H01L 23/10; H01L 23/34
[52] U.S. Cl. .............................. 257/706; 257/691
[58] Field of Search .............................. 257/706, 720, 257/705, 707, 691

[56] References Cited

U.S. PATENT DOCUMENTS

| | | | |
|---|---|---|---|
| 5,262,927 | 11/1993 | Chia et al. | 287/706 |
| 5,392,193 | 2/1995 | Robertson, Jr. et al. | |
| 5,394,298 | 2/1995 | Sagisaka | 287/706 |
| 5,465,008 | 11/1995 | Goetz et al. | 287/691 |

FOREIGN PATENT DOCUMENTS

| | | | |
|---|---|---|---|
| 61-4250 | 1/1986 | Japan | 257/206 |
| 3-20648 | 9/1991 | Japan | 257/706 |
| 5-74972 | 3/1993 | Japan | 257/207 |

Primary Examiner—Mahshid D. Saadat
Assistant Examiner—S. V. Clark
Attorney, Agent, or Firm—Richard A. Sonnentag

[57] ABSTRACT

An apparatus to improve upon the problem of mismatched CTEs in electrical circuits comprises a small heat sink (206), a substrate (202), and an aperture existing within the substrate (202). The heat sink (206) is located on one side of the substrate (202) in a location substantially overlapping the aperture (204). The transistor (106) is coupled to the heat sink (206) and extends through the aperture (204). The apparatus reduces manufacturing costs since no exotic bonding agents are needed to accommodate for the mismatch in CTEs. Additionally, the apparatus reduces the number of substrates required during the manufacturing process, and allows for the heat sink (206) to be soldered in an automated fashion to the bottom of the substrate (202) in much the same way component parts are reflowed onto the top of a printed circuit board.

22 Claims, 3 Drawing Sheets

APPARATUS AND METHOD FOR MOUNTING A COMPONENT TO AN ELECTRICAL CIRCUIT

FIELD OF THE INVENTION

The invention relates generally to electrical circuits, and more specifically to the mounting components to such electrical circuits.

BACKGROUND OF THE INVENTION

Typical power amplifiers are constructed by interconnecting multiple "gain blocks" as shown in FIG. 1. These gain blocks are generally made up of substrates 104 and 108 that straddle the component (in this case a power transistor 106). More specifically, substrates 104 and 108, containing other component parts (not shown) are mounted onto a metallic plate 102. The metallic plate 102 is usually formed of a metal or alloy that has good electrical conductivity and heat transfer characteristics while the substrates 104 and 108 are typically made of a ceramic, or printed-circuit-board (PCB) type material. The transistor 106 is then mounted onto the metallic plate 102 in such a way as to be straddled by the substrates 104 and 108. The substrates 104 and 108 are connected to the transistor 106 via connector elements 110 and 112 that are soldered onto the substrates 104 and 108, with the metallic plate 102 acting as a ground plane for the device. In addition to serving as a ground plane, the metallic plate 102 also serves to dissipate the heat generated by the transistor 106.

One problem that exists with the current construction of power amplifiers in this gain block manner is there exists a mismatch in the coefficient of thermal expansion (CTE) between the substrates and the metallic plate. Because of this mismatch, the bonding area between the two needs to be quite small. This results in several problems: (1) the substrates are left unsupported over most of the metallic plate, which leads to a weak mechanical assembly, (2) the grounding of the substrate is, in most conditions, inadequate and somewhat unreliable, and (3) expensive bonding agents need to be utilized to accommodate for the mismatch in CTE. In addition to the problems with matching the CTE between the substrates and the metallic plate, the use of a bulky metal plate results in high material costs as well as a very heavy final part.

Thus a need exists for an apparatus which can effectively dissipate heat in a transistor, but has a low weight, eliminates the need to match CTEs, and is inexpensive to produce.

DETAILED DESCRIPTION OF A PREFERRED EMBODIMENT

The present invention solves the above mentioned problems by replacing the bulky metal plate with a much smaller heat sink. The heat sink is coupled locally to the substrate in the area surrounding only the transistor. By replacing the bulky metallic plate with a much smaller, localized heat sink, manufacturing costs are reduced since no exotic bonding agents are needed to accommodate for the mismatch in CTEs. In addition, the elimination of the bulky metal plate reduces the number of substrates needed during the manufacture of gain blocks, and allows for the heat sink to be cheaply soldered in an automated fashion to the bottom of the substrate in much the same way component parts are reflowed onto the top of a printed circuit board.

If the substrate is fabricated or altered to expose an internal ground layer, an additional benefit is achieved since the heat sink can be bonded directly to this exposed internal ground layer. Bonding the heat sink directly to the internal ground layer of the substrate gives the shortest return path for the transistor, which improves the electrical performance of the amplifier.

Generally stated, in one embodiment in accordance with the present invention, the apparatus comprises a substrate, having a first and a second opposing side. A ground layer exists internal to the substrate and an aperture extends through the substrate. A recessed area is located on a first side of the substrate and exists circumferentially around the aperture. This recessed area at least partially exposes the internal ground layer. A heat sink having a first and a second side is mounted on its first side to the first side of the substrate at the exposed internal ground layer, and at least partially overlaps the substrate aperture. A transistor is coupled to the first side of the heat sink, at least a portion of the transistor being located within the substrate aperture. The transistor is then coupled to the substrate via connector elements.

Figure 2:
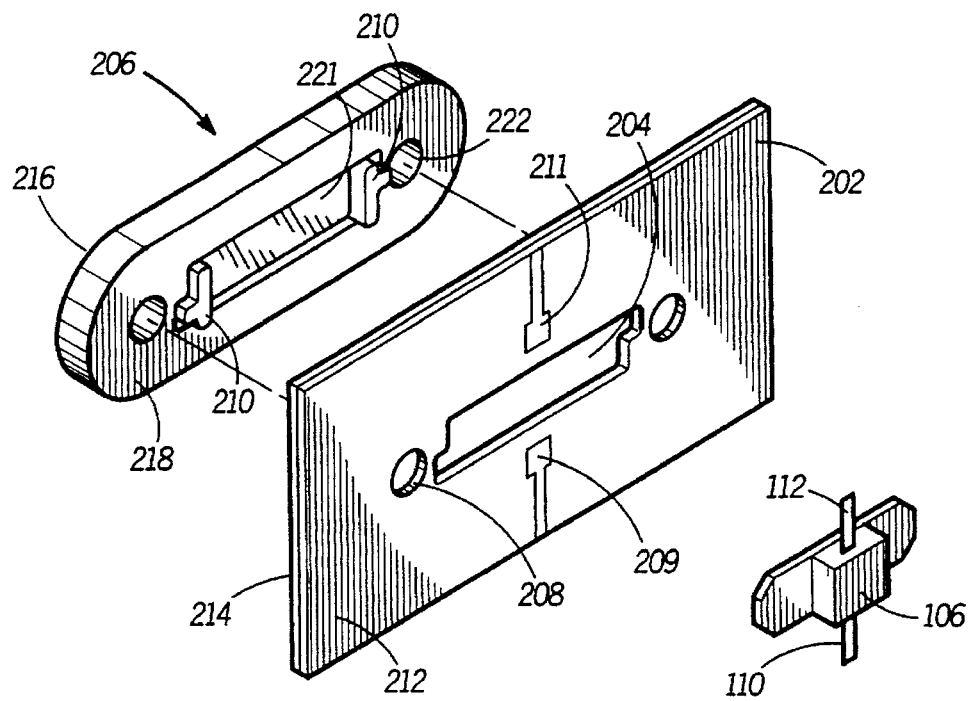
FIG. 2 shows an exploded, top angle view of the heat, substrate, and transistor in accordance with the invention.
Figure 3:
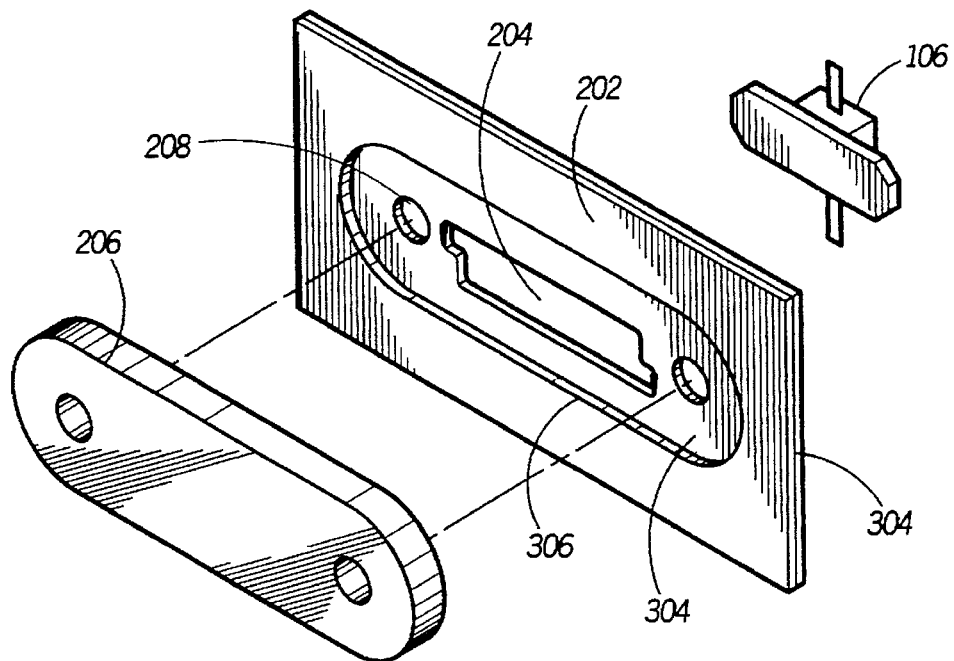
FIG. 3 shows an exploded, bottom angle view of the heat sink, substrate, and transistor in accordance with the invention.

FIG. 2 shows an exploded, top angle view of the heat sink 206, substrate 202, and transistor 106 in accordance with the invention. It can be seen that the multiple substrates 104 and 108 and the bulky metal plate 102 of the prior art have been eliminated, and in their place a single substrate 202 and a small heat sink 206 is used. In the preferred embodiment, the substrate 202 is a printed circuit board (PCB) type material, but one of the ordinary skill in the art will appreciate that other substrates (ceramic, for example) may be incorporated. The heat sink 206 can be formed of a metal or alloy that has good electrical conductivity and heat transfer characteristics As seen in FIG. 2 and FIG. 3, the first side 218 of the heat sink 206 is coupled to the first side 214 of the substrate 202 over a substrate aperture 204. In order to help alignment of the heat sink 206 with the substrate 202, the heat sink 206 is equipped with extended regions 210. As one of ordinary skill in the art would recognize, the extended regions 210 can be designed in any shape to accommodate the alignment of the heat sink 206 to the substrate 202. The extended regions 210 can also be designed to provide a pressure fit between the substrate 202 and the heat sink 206 to facilitate coupling of the two. In the preferred embodiment, the coupling of the substrate 202 and the heat sink 206 is accomplished by an infrared reflow bonding operation, but other methods of coupling exist. As best seen in FIG. 3, the substrate 202 includes a recessed area 306 to facilitate the attachment of the heat sink 206. In the preferred embodiment, the recessed area 306 is just large enough to accommodate the heat sink 206. This is done to provide the substrate 202 with the maximum possible volume (strength). The recessed area 306 is fabricated to expose an internal ground layer 304 existing within the substrate 202. By coupling the heat sink 206 directly to the internal ground layer 304, the shortest return path for the device is created.

After the heat sink 206 has been mounted to the substrate 202, the transistor 106 is then coupled to the heat sink 218. When coupled to the heat sink 206, the transistor 106 extends through the substrate aperture 204. In addition to helping align the heat sink 206 to the substrate 202, the extended regions 210 can also be used to align the transistor 106 to the heat sink 206. As best seen in FIG. 2, the heat sink 206 has a recessed region (or heat sink pocket) 221 to accommodate the transistor 106. The extended regions 210 and the heat sink pocket 221 can be designed to provide a pressure fit between the transistor 106 and the heat sink 206 to facilitate coupling of the two. Again, in the preferred embodiment, the coupling of the transistor 106 and the heat sink 206 is accomplished by an infrared reflow bonding operation.

The extended regions 210 and the heat sink pocket 221, can be used in conjunction with (or replaced by) alignment holes 208, 222 which can accommodate fasteners such as screws (not shown) which can hold the heat sink 206 to the substrate 202 during the bonding process. In the preferred embodiment, the alignment holes 208, 222 are also used to mount the assembled unit to a housing (not shown).

Figure 1:
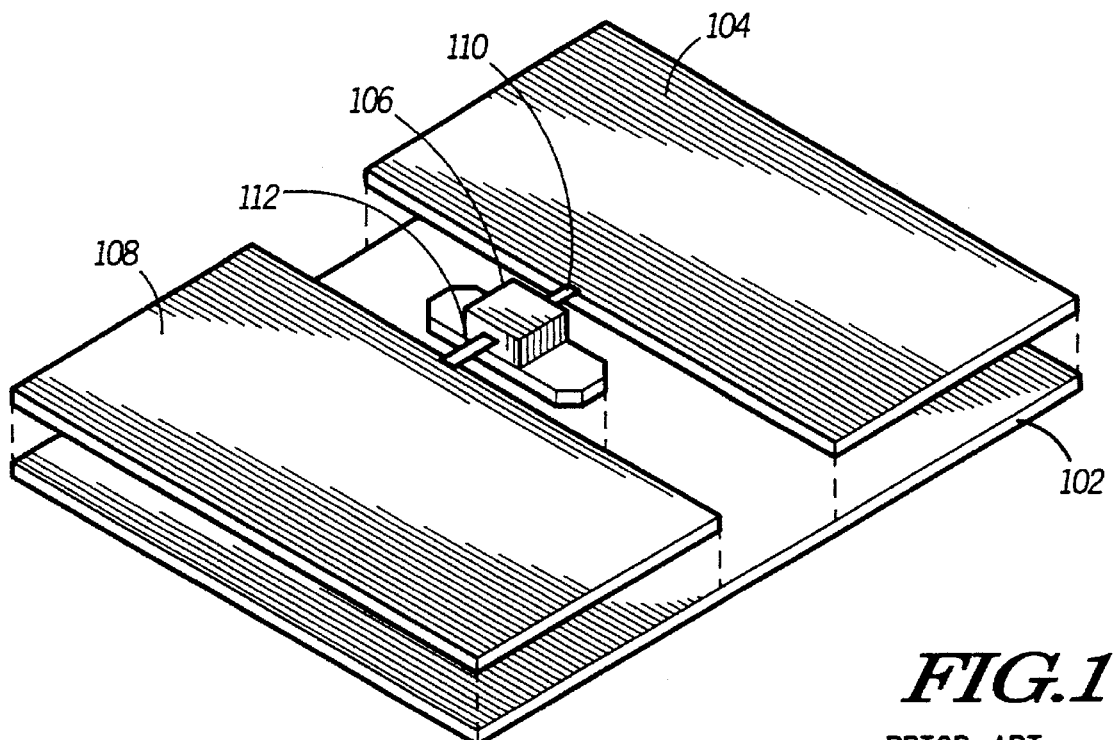
FIG. 1 shows a prior art power amplifier gain block.
Figure 4:
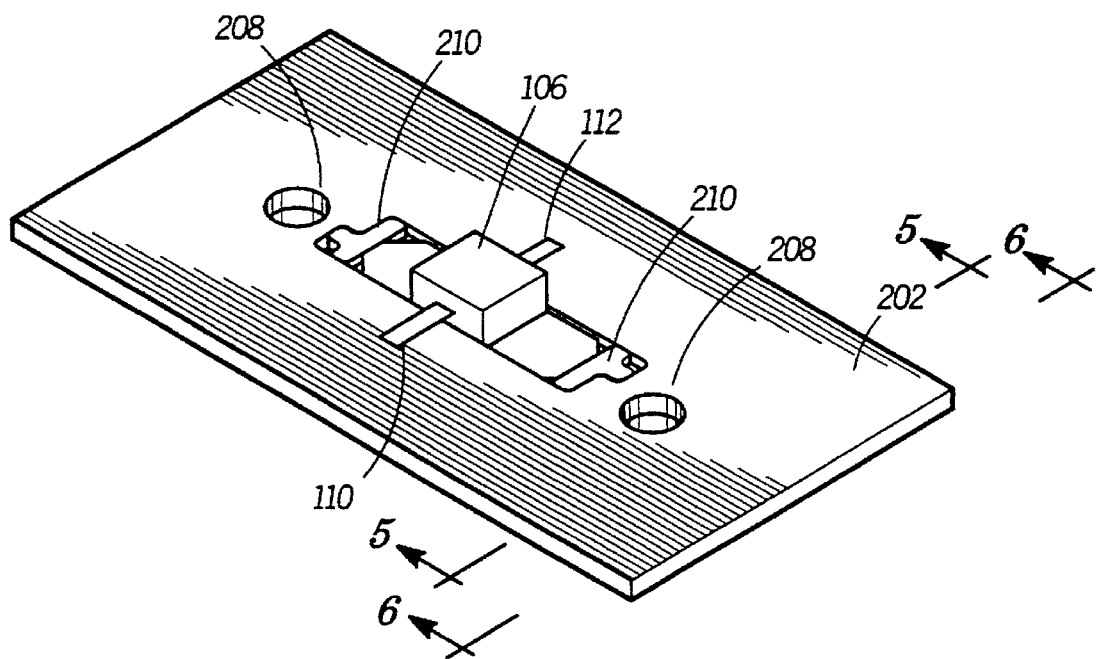
FIG. 4 shows an assembled view of the heat sink, substrate, and transistor in accordance with the invention.

FIG. 4 shows an assembled apparatus in accordance with the invention. In this view the transistor 106 is shown resting in the heat sink pocket 221 between the extended regions 210. It can be seen that the extended regions 210 not only help align the transistor 106 to the heat sink 206, but also properly align the heat sink 206 to the substrate 202. Once the transistor 106 has been positioned properly, it can then be electrically connected to the substrate 202 by bonding the connector elements 110 and 112 to the runners 209 and 211 (respectively) located on the second surface 212 of the substrate 202.

Figure 5:
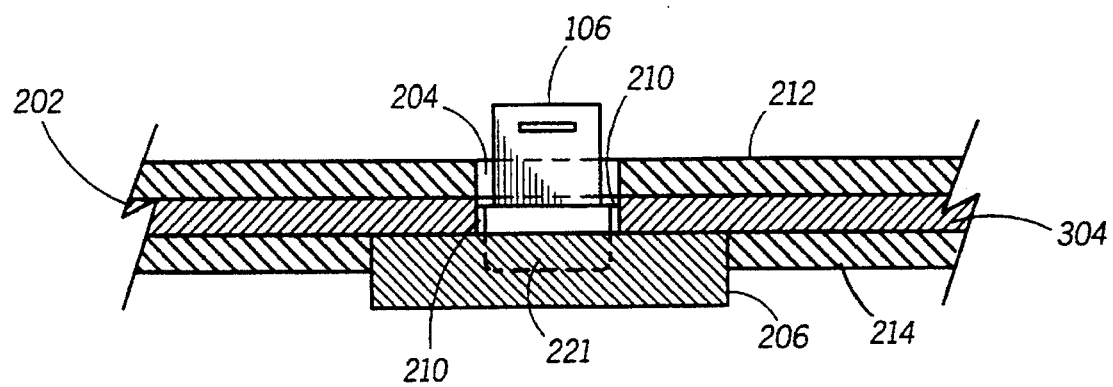
FIG. 5 shows an edge-on, cutaway view of the assembled heat sink, substrate, and transistor of the preferred embodiment in accordance with the invention.

FIG. 5 shows an edge-on, cutaway view of the assembled unit depicted in FIG. 4. In this view, it can be seen that the heat sink 206 is coupled to the substrate 202 at the internal ground plane 304. The heat sink 206 is mounted in such a way as to straddle the aperture 204 existing through the substrate 202. The transistor 106 rests within the heat sink pocket 221, between the extended regions 210. The transistor 106 is coupled to the heat sink 206 in such a way as to sit within the aperture 204.

Figure 6:
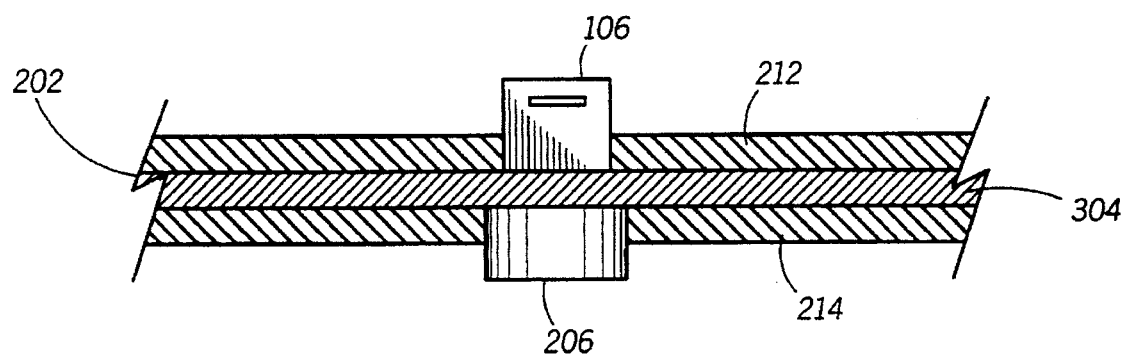
FIG. 6 shows an edge-on, cutaway view of the assembled heat sink, substrate, and transistor, in an alternate embodiment in accordance with the present invention.

FIG. 6 shows an edge-on, cutaway view of the assembled heat sink 206, substrate 202, and transistor 106 in an alternate embodiment in accordance with the present invention. Unlike FIG. 5, the transistor 106 and the heat sink 206 of FIG. 6 are not mounted to one another, but directly to an internal ground layer 304 substantially opposite one another. Heat generated by the transistor 106 is drawn from the transistor 106 and passes through the internal ground layer 304 and into the heat sink 206.

The descriptions of the invention, the specific details, and the drawings mentioned above, are not meant to limit the scope of the present invention. For example, in addition to transistors, the invention could also be used for other components that generate excessive amounts of heat (such as power regulators and resisters). It is the intent of the inventors that various modifications can be made to the present invention without varying from the spirit and scope of the invention, and it is intended that all such modifications come within the scope of the following claims.

What we claim is:

1. An apparatus comprising:
    a) a substrate having first and second opposing sides, a substrate aperture and an internal ground layer existing internal to the substrate the internal ground layer existing substantially between the first and the second opposing sides of the substrate;
    b) a heat sink having a first and a second side, wherein the first side of the heat sink is coupled to the substrate at the internal ground layer and at least partially overlaps the substrate aperture; and
    c) a component coupled to the heat sink, wherein at least a portion of the component is located within the substrate aperture.

2. The apparatus of claim 1, wherein the heat sink is coupled to the substrate via a soldering process.

3. The apparatus of claim 1, wherein the heat sink is coupled to the substrate via an infrared reflow bonding operation.

4. The apparatus of claim 1, wherein the substrate further comprises a printed-circuit-board type material.

5. The apparatus of claim 1, wherein the substrate further comprises a ceramic material.

6. The apparatus of claim 1, wherein the heat sink includes an extended region for positioning the heat sink with the substrate.

7. The apparatus of claim 1, wherein the heat sink includes a recessed region for positioning the component within the heat sink.

8. The apparatus of claim 7, wherein the transistor is coupled to the first side of the heat sink and located at least partially within the substrate aperture and the recessed region of the heat sink.

9. An apparatus for mounting a component to an electrical circuit, the apparatus comprising:
    a) a substrate, having a first and a second opposing side;
    b) an internal ground layer existing internal to the substrate;
    c) an aperture extending through the substrate and the internal ground layer;
    d) a recessed area, located circumferentially around the aperture, existing on the first side of the substrate, which at least partially exposes the internal ground layer creating an exposed internal ground layer;
    e) a heat sink having a first and a second side, wherein the first side of the heat sink is coupled to the substrate at the exposed internal ground layer, and at least partially overlaps the substrate aperture;
    f) a transistor coupled to the first side of the heat sink, wherein at least a portion of the transistor is located within the aperture.

10. The apparatus of claim 9, wherein the heat sink is coupled to the exposed internal ground layer via a soldering process.

11. The apparatus of claim 9, wherein the heat sink is coupled to the exposed internal ground layer via an infrared reflowable bonding operation.

12. The apparatus of claim 9, wherein the substrate further comprises a printed-circuit-board type material.

13. The apparatus of claim 9, wherein the substrate further comprises a ceramic material.

14. The apparatus of claim 9, wherein the heat sink includes a guide for positioning the transistor.

15. An apparatus for mounting a component to an electrical circuit, the apparatus comprising:
    a) a ground layer having a first and a second side;
    b) a first insulating layer coupled to the first side of the ground layer;
    c) a first aperture extending through the first insulating layer;

d) a second insulating layer coupled to the second side of the ground layer;

e) a second aperture extending through the second insulating layer, and at least partially overlapping the first aperture;

f) a transistor coupled to the ground layer, at least a portion of the transistor located within the first aperture;

g) a heat sink, coupled to the ground layer, at least a portion of the heat sink located within the second aperture.

16. The apparatus of claim 15, wherein a third aperture exists within the ground layer, the third aperture at least partially overlapping the first and the second aperture.

17. The apparatus of claim 15, wherein the heat sink is coupled to the ground layer via a soldering process.

18. The apparatus of claim 15, wherein the heat sink is coupled to the ground layer via an infrared reflowable bonding operation.

19. The apparatus of claim 15, wherein the first insulating layer and the second insulating layer further comprises a printed-circuit-board type material.

20. The apparatus of claim 15, wherein the first insulating layer and the second insulating layer further comprises a ceramic material.

21. The apparatus of claim 15, wherein the heat sink includes a guide for positioning the transistor.

22. A method of mounting a component onto a substrate having a first and a second side and a substrate aperture, the first and the second side opposing one another, the method comprising the steps of:

a) coupling to an internal ground layer of the substrate, a heat sink having a first and a second side, wherein the internal ground layer exists internal to the substrate substantially between the first and the second opposing sides and the first side of the heat sink at least partially overlaps the substrate aperture; and b) coupling to the first side of the heat sink, the component, at least a portion of the component located within the substrate aperture.

* * * * *